(12) United States Patent
Li et al.

(10) Patent No.: US 10,476,004 B2
(45) Date of Patent: Nov. 12, 2019

(54) METHOD OF MANUFACTURING FLEXIBLE DISPLAY PANEL

(71) Applicant: WUHAN CHINA STAR OPTOELECTRONICS SEMICONDUCTOR DISPLAY TECHNOLOGY CO., LTD., Wuhan, Hubei (CN)

(72) Inventors: Xiang Li, Hubei (CN); Wei Yu, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 7 days.

(21) Appl. No.: 15/580,815

(22) PCT Filed: Oct. 27, 2017

(86) PCT No.: PCT/CN2017/107995
§ 371 (c)(1),
(2) Date: Dec. 8, 2017

(87) PCT Pub. No.: WO2019/037234
PCT Pub. Date: Feb. 28, 2019

(65) Prior Publication Data
US 2019/0067575 A1 Feb. 28, 2019

(30) Foreign Application Priority Data
Aug. 25, 2017 (CN) .......................... 2017 1 0738998

(51) Int. Cl.
*H01L 21/00* (2006.01)
*H01L 51/00* (2006.01)
(Continued)

(52) U.S. Cl.
CPC ........ *H01L 51/003* (2013.01); *H01L 27/3244* (2013.01); *H01L 51/0097* (2013.01);
(Continued)

(58) Field of Classification Search
CPC ............... H01L 51/003; H01L 51/0097; H01L 2251/5338
See application file for complete search history.

(56) References Cited

U.S. PATENT DOCUMENTS 9,082,732 B2 * 7/2015 Goto ................... H01L 27/3218
9,704,930 B2 * 7/2017 Wang .................. H01L 27/3213
(Continued)

FOREIGN PATENT DOCUMENTS

CN      106229421 A    12/2016
CN      106653812 A     5/2017

*Primary Examiner* — Laura M Menz
(74) *Attorney, Agent, or Firm* — Hauptman Ham, LLP

(57) ABSTRACT

A method for manufacturing a flexible display panel includes the steps of: step S1, providing a carrier substrate on which a groove conforming to a size of a flexible display panel is formed on one side of the carrier substrate; step S2, formed a flexible substrate in the groove; step S3, forming a thin film transistor, an organic light emitting diode layer, and an encapsulation layer on the flexible substrate to form the flexible display panel; and step S4, directly remove the flexible display panel from the carrier substrate.

10 Claims, 3 Drawing Sheets

(51) Int. Cl.
*H01L 27/32* (2006.01)
*H01L 51/56* (2006.01)
*H01L 51/52* (2006.01)

(52) U.S. Cl.
CPC .......... *H01L 51/5237* (2013.01); *H01L 51/56* (2013.01); *H01L 2227/326* (2013.01); *H01L 2251/5338* (2013.01)

(56) References Cited

U.S. PATENT DOCUMENTS

| | | | |
|---|---|---|---|
| 9,722,205 B2* | 8/2017 | Wang | H01L 51/003 |
| 10,056,569 B2* | 8/2018 | Lee | B32B 3/30 |
| 2006/0118796 A1* | 6/2006 | Cheng | B82Y 30/00 |
| | | | 257/88 |
| 2015/0001514 A1* | 1/2015 | Goto | H01L 27/3218 |
| | | | 257/40 |
| 2015/0021559 A1* | 1/2015 | Han | H01L 51/524 |
| | | | 257/40 |
| 2016/0009958 A1* | 1/2016 | Moore | C09D 5/008 |
| | | | 428/417 |
| 2016/0227624 A1* | 8/2016 | Yun | H05B 33/26 |
| 2016/0254483 A1* | 9/2016 | Wang | H01L 51/003 |
| | | | 257/40 |
| 2017/0023979 A1* | 1/2017 | Yamazaki | G06F 1/1652 |
| 2017/0194365 A1* | 7/2017 | Cai | H01L 51/56 |
| 2017/0317301 A1* | 11/2017 | Xie | H01L 21/77 |
| 2018/0130974 A1* | 5/2018 | Koo | H01L 51/0097 |
| 2018/0145255 A1* | 5/2018 | Yu | H01L 27/1266 |
| 2018/0158805 A1* | 6/2018 | Fan | H01L 25/0753 |
| 2019/0157623 A1 | 5/2019 | Qin | |

* cited by examiner

METHOD OF MANUFACTURING FLEXIBLE DISPLAY PANEL

FIELD OF INVENTION

This disclosure relates to display panel technology, and more particularly to a method of manufacturing flexible display panels.

BACKGROUND OF INVENTION

With continuous improvement in display technology quality, organic light-emitting diodes (OLEDs) are widely used in flat panel displays, lighting, and backlighting, and have been gradually used in our lives.

In recent years, rapid development in flexible organic light-emitting diodes (OLEDs) have lead to a greatly improved screen size and display quality of a flexible, deformable display. Whether it is a cathode ray tube display (CRT), a mainstream LCD display, or an organic light emitting diode (OLED) screen with a glass substrate, usually using a rigid screen, there is a risk of damage due to use of steel material. However, the flexible organic light emitting diode (OLED) screen has advantages of bendability, impact resistance, strong shock resistance, light weight and portable, and the flexible substrate of the flexible organic light-emitting diodes (FOLED) is made of polyethylene (PE), polypropylene (PP), polystyrene (PS), polyethylene terephthalate (PET), and polyethylene naphthalate (PEN).

In current flexible OLED device process methods, first, a flexible base material is coated on an entire surface of the carrier glass substrate to form a flexible substrate, and a thin film transistor, an organic light emitting diode layer, and a package layer are formed on the flexible substrate, and then the whole is packaged. Next, the entire carrier glass substrate having a flexible base layer is cut with a laser cutter machine to form an initial panel. Last, a flexible display panel is peeled from the carrier glass substrate with a laser stripping machine (laser lift-off) to form a desired flexible organic light emitting diode (OLED) device.

SUMMARY OF INVENTION

The object of this disclosure is to provide a method of manufacturing a flexible display panel for directly forming a flexible display panel on a flexible substrate and directly stripped the flexible display panel from the carrier substrate, which without cutting operation.

This disclosure provides a method of manufacturing a flexible display panel, comprising the steps of: in a step S1, forming a groove conforming to a size of a flexible display panel on one surface of a carrier substrate; in a step S2, forming a flexible substrate in the groove; in a step S3, forming a thin film transistor, an organic light emitting diode layer, and an encapsulation layer on the flexible substrate to form the flexible display panel; and in a step S4, directly remove the flexible display panel from the carrier substrate.

In accordance with one embodiment, the invention is directed towards a method of manufacturing the flexible display panel, in step S1, the carrier substrate is a glass substrate.

In accordance with one embodiment, the invention is directed towards a method of manufacturing the flexible display panel, in step S1, the groove is formed by etching.

In accordance with one embodiment, the invention is directed towards a method of manufacturing the flexible display panel, the groove is a trapezoidal groove, and an area of a notch of the groove is smaller than an area of a bottom surface of the groove.

In accordance with one embodiment, the invention is directed towards a method of manufacturing the flexible display panel, in step S2, the flexible substrate is made of polyimide.

In accordance with one embodiment, the invention is directed towards a method of manufacturing the flexible display panel, the step of forming the flexible substrate in the groove in step S2 further comprises: in a step S21, coating the polyimide material on one side of the carrier substrate having the groove so that a part of the polyimide material flows slowly into the groove to form a polyimide layer; and in a step S22, forming the flexible substrate by patterning the poly polyimide layer.

In accordance with one embodiment, the invention is directed towards a method of manufacturing the flexible display panel, in step S22, the flexible substrate is not connected to the polyimide layer of the carrier substrate.

In accordance with one embodiment, the invention is directed towards a method of manufacturing the flexible display panel, a plurality of grooves are provided.

In accordance with one embodiment, the invention is directed towards a method of manufacturing the flexible display panel, the grooves are arranged in an array.

In accordance with one embodiment, the invention is directed towards a method of manufacturing the flexible display panel, in step S3, the organic light emitting diode layer is arranged between the thin film transistor and the encapsulation layer.

It is an advantage of the present invention to provide a method of manufacturing a flexible display panel capable of directly forming a separate flexible display panel module (initial template) on a glass substrate, and capable of directly stripped to the separate initial template with a laser stripper machine to form a separate flexible display panel, thus reducing the laser cutting process steps and production costs, and improve production efficiency.

DESCRIPTION OF DRAWINGS

To make the above embodiments of this disclosure more comprehensible, the preferred embodiments being adopted by this disclosure to achieve the above and other objectives can be best understood by referring to the following detailed description of the preferred embodiments and the accompanying drawings as detailed below.

DETAILED DESCRIPTION OF PREFERRED EMBODIMENTS

In order to more clearly describe the embodiments of this disclosure or the conventional technical solutions, the description is used to make a simple introduction of the drawings used in the following embodiments. The following description of the drawings are merely some embodiments of this disclosure, and the direction terms mentioned in the present invention, such as "upper", "lower", "front", "rear", "left", "right", "top", "bottom", etc., are only with reference to the attached figures and by to illustrate the invention and not to limit the invention.

Figure 5:
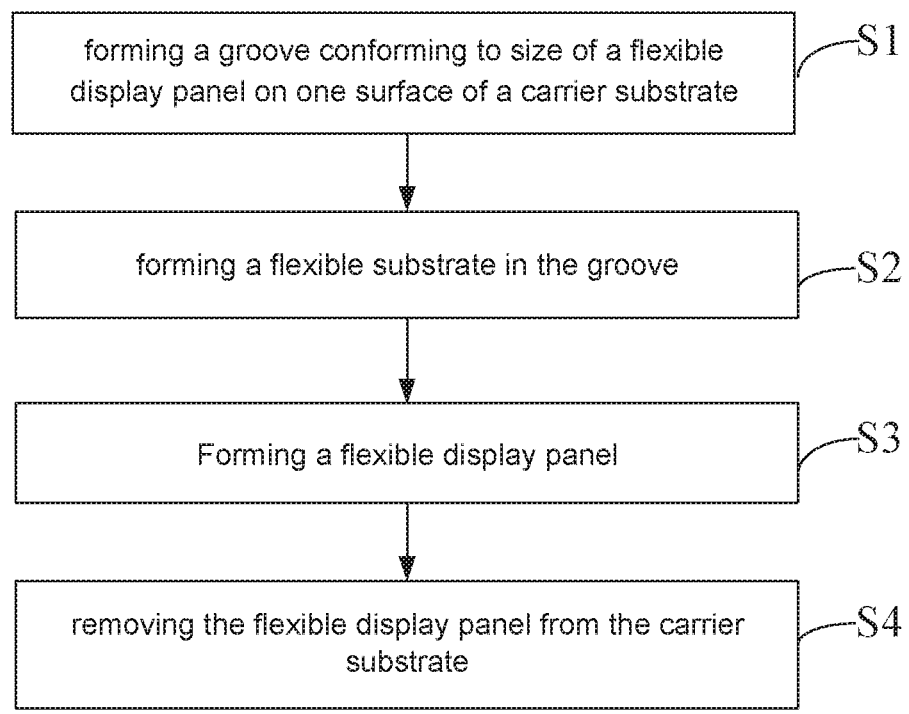
FIG. 5 is a step flowchart of a method of manufacturing a flexible display panel according to a preferred embodiment of this disclosure.

Referring to FIG. 5, a flowchart of a method of manufacturing a flexible display panel according to a preferred embodiment of this disclosure is shown. As shown in FIG. 5, the preferred embodiment provides a method for manufacturing a flexible display panel, which comprises the following steps.

Figure 1:
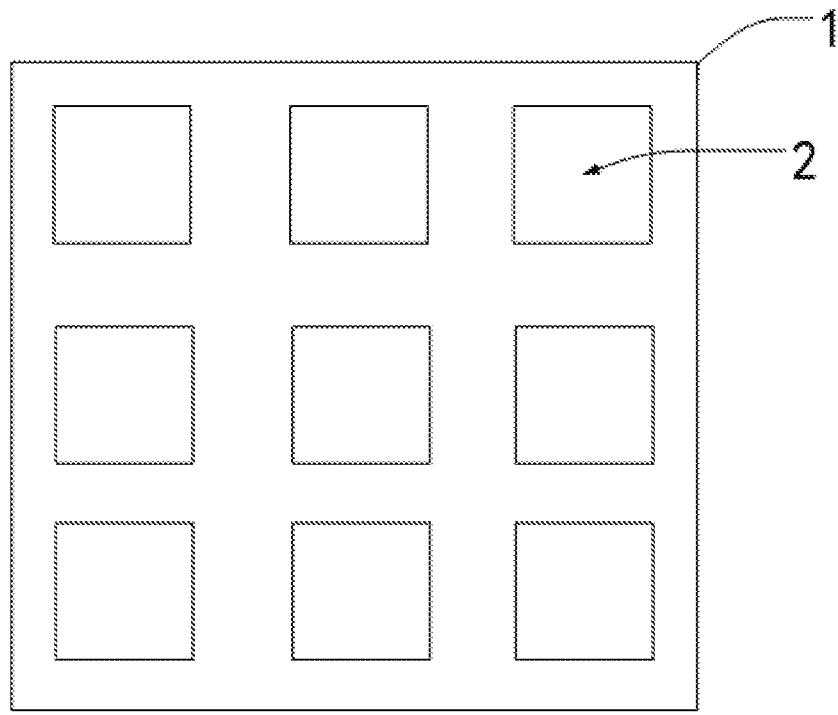
FIG. 1 is a top view of a carrier substrate having a groove in the process of a method of manufacturing the flexible display panel according to a preferred embodiment of this disclosure.
Figure 2:
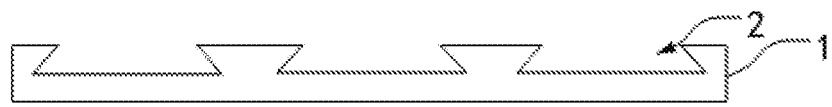
FIG. 2 is a cross-sectional view of FIG. 1 of a preferred embodiment of this disclosure.

Referring to FIG. 1 and FIG. 2, in Step S1, providing a carrier substrate 1 on which a groove 2 conforming to a size of a flexible display panel is formed on one surface of the carrier substrate 1. In general, because the glass substrate has more advantages, such as good rigidity, low cost, suitable for cutting, etc., a glass substrate is used as a carrier substrate 1. The groove 2 is etched on the glass substrate, but because the etching has a high accuracy, facilitates control of shape of the groove 2, and does not easily break the glass during the formation of the groove 2, so that the production process is smooth First, in the present embodiment, shape of the groove 2 needs to conform to size of the flexible display panel. If the size is too large, it is necessary to modify subsequent processing, which will cause the process to become complicated, and if the size is too small, resulting in the size of the flexible display panel does not meet the specifications, it can only be regarded as waste or secondary products.

In the present embodiment, the groove 2 is a trapezoidal groove, and an area of a notch of the groove 2 is smaller than an area of a bottom surface of the groove 2, which is advantageous for formation of the flexible substrate 3 in the step S2. Of course, other different shapes of the design can be made according to the actual shape of the flexible display panel needs, such as a circular truncated cone.

In order to improve production efficiency, a plurality of grooves 2 can be formed on one glass substrate, and the production efficiency of the grooves 2 and the efficiency of the subsequent processing steps can be improved for production of the grooves 2. In the present embodiment, the groove 2 are arranged in an array.

Figure 3:
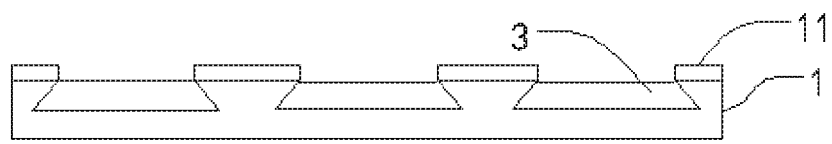
FIG. 3 is a structural schematic view of a carrier substrate having a flexible substrate in the process of the method of manufacturing the flexible display panel according to a preferred embodiment of this disclosure.

In a Step S2, forming a flexible substrate 3 in the grooves 2; as shown in FIG. 3.

In the present embodiment, the flexible substrate 3 is made of polyimide. Since the polyimide material is fluid at a certain temperature and the surface of the glass substrate is smooth, in order to allow the polyimide material to be uniformly distributed in the groove 2 and the surface of the glass substrate, the polyimide material may be coated with a polyimide material coater (IP coater) or other apparatus to the carrier substrate 1 has one side of the groove 2.

Figure 6:
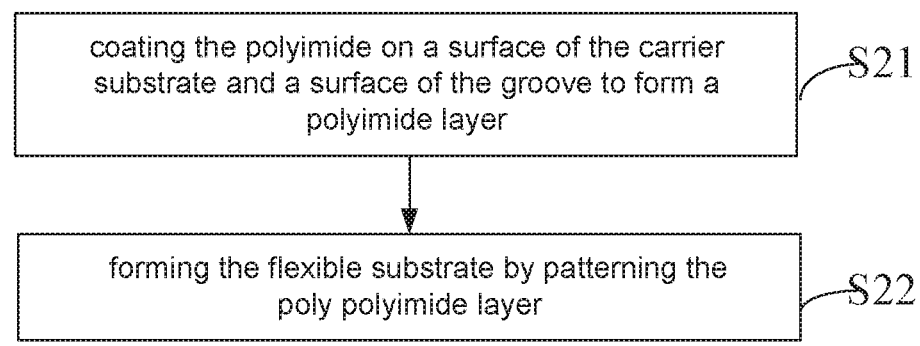
FIG. 6 is a concrete step flowchart of step S2 in FIG. 5 of a preferred embodiment of this disclosure.

In the present embodiment, more specifically, as shown in FIG. 6, the step of forming the flexible substrate in the groove in Step S2 further comprises the following steps.

In a step S21, coating the polyimide material on one side of the carrier substrate having the groove 2 so that a part of the polyimide material flows slowly into the groove 2 to form a polyimide layer. The polyimide layer is a flexible layer 11.

In a step S22, forming the flexible substrate 3 by patterning the poly polyimide layer (the flexible layer 11). The flexible substrate 3 is not connected to the flexible layer 11 of the carrier substrate 1, that is, the flexible substrate 3 and the flexible layer 11 located on the surface of the carrier substrate 1 are separated from each other.

In the present embodiment, forming a plurality of grooves 2 on the glass substrate 1. In order to distinguish the flexible substrate 3 in the different grooves 2 and to show the notch shape and size of the grooves 2, thus, forms a flexible layer 11 on the surface of the glass substrate 1 around the notch of the grooves 2 with a polyimide material, and the flexible layer 11 is not connected to the flexible substrate 3. At the same time, the flexible layer 11 has a protective effect in making the flexible display panel, and to prevent the hard contact with the glass substrate processing, to avoid damage to the glass substrate 1.

The present invention relates to the method of manufacturing the flexible display panel. The flexible substrate 3 may also be formed of other flexible materials, such as polyethylene (PE), polypropylene (PP), polystyrene (PS), polyethylene terephthalate (PET), and polyethylene naphthalate (PEN), etc. in the prior art.

Figure 4:
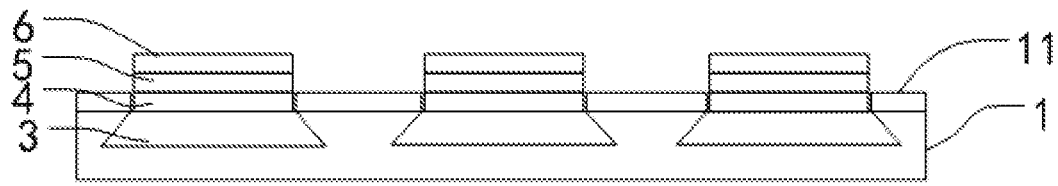
FIG. 4 is a structural schematic view of a carrier substrate having a flexible substrate in the process of the method of manufacturing the flexible display panel according to a preferred embodiment of this disclosure.

Referring to FIG. 4. In a Step S3, forming a thin film transistor 4, an organic light emitting diode layer 5, and an encapsulation layer 6 on the flexible substrate 3 to form the flexible display panel.

In the step S3, the thin film transistor 4 is located on the flexible substrate 3, and the encapsulation layer 6 is located on the thin film transistor 4, and the organic light emitting diode layer 5 is arranged between the thin film transistor 4 and the encapsulation layer 6.

In a Step S4, directly remove the flexible display panel from the carrier substrate 1. In the step, the entirety of the flexible display panel is peeled off from the groove 2 on the carrier substrate 1 directly by a laser stripper machine, thereby saving a laser cutting step.

This disclosure has been described with preferred embodiments thereof, and it is understood that many changes and modifications to the described embodiment can be carried out without departing from the scope and the spirit of the invention that is intended to be limited only by the appended claims.

What is claimed is:

1. A method of manufacturing a flexible display panel, comprising steps of:
   Step S1, forming a groove conforming to size of a flexible display panel on one surface of a carrier substrate;
   Step S2, forming a flexible substrate in the groove;
   Step S3, forming a thin film transistor, an organic light emitting diode layer, and an encapsulation layer on the flexible substrate to form the flexible di splay panel; and
   Step S4, removing the flexible display panel from the carrier substrate.

2. The method of manufacturing the flexible display panel according to claim 1, wherein the carrier substrate in step S1 is a glass substrate.

3. The method of manufacturing the flexible display panel according to claim 1, wherein the groove in step S1 is formed by etching.

4. The method of manufacturing the flexible display panel according to claim 1, wherein the groove is a trapezoidal groove, and an area of a notch of the groove is smaller than an area of a bottom surface of the groove.

5. The method of manufacturing the flexible display panel according to claim 1, wherein the flexible substrate in step S2 is made of polyimide.

6. The method of manufacturing the flexible display panel according to claim 5, wherein the step of forming the flexible substrate in the groove in step S2 further comprises:
   Step S21, coating the polyimide on one side of the carrier substrate having the groove so that a part of the polyimide flows slowly into the groove to form a polyimide layer; and
   Step S22, forming the flexible substrate by patterning the polyimide layer.

7. The method of manufacturing the flexible display panel according to claim 6, wherein the flexible substrate in step S22 is not connected to the polyimide layer of the carrier substrate.

8. The method of manufacturing the flexible display panel according to claim 1, wherein a plurality of grooves are provided on one surface of the carrier substrate.

9. The method of manufacturing the flexible display panel according to claim 8, wherein the grooves are arranged in an array.

10. The method of manufacturing the flexible display panel according to claim 1, wherein the organic light emitting diode layer is arranged between the thin film transistor and the encapsulation layer.

* * * * *